US012243585B1

(12) United States Patent
M Siddiqui et al.

(10) Patent No.: US 12,243,585 B1
(45) Date of Patent: Mar. 4, 2025

(54) MEMORY WRITE ASSIST

(71) Applicant: Synopsys, Inc., Mountain View, CA (US)

(72) Inventors: M Sultan M Siddiqui, Noida (IN); Md Amir Arif, New Delhi (IN); Tejaswini Saini, Uttam Nagar (IN); Sudhir Kumar, Shastri Nagar (IN); Ravindra Shrivastava, Noida (IN)

(73) Assignee: Synopsys, Inc., Sunnyvale, CA (US)

( * ) Notice: Subject to any disclaimer, the term of this patent is extended or adjusted under 35 U.S.C. 154(b) by 174 days.

(21) Appl. No.: 18/168,847

(22) Filed: Feb. 14, 2023

(51) Int. Cl.
*G11C 11/24* (2006.01)
*G11C 11/419* (2006.01)

(52) U.S. Cl.
CPC .................................. *G11C 11/419* (2013.01)

(58) Field of Classification Search
CPC . G11C 11/404; G11C 11/405; G11C 11/4074; G11C 11/4091; H01L 27/108
USPC .................................................. 365/149, 226
See application file for complete search history.

(56) References Cited

U.S. PATENT DOCUMENTS 10,566,975 B1 * 2/2020 Tiwari ................ G06F 13/4004
2016/0247557 A1 8/2016 Jeong et al.

OTHER PUBLICATIONS

A. Ferreron, et al., "Concertina: Squeezing in Cache Content to Operate at Near-Threshold Voltage," IEEE Trans. Comput., vol. 65, No. 3, pp. 755-769, Mar. 2016.
A. Sodani, "Race to Exascale: Opportunities and challenges," Proc. Keynote Annu. IEEE/ACM 44th Annu. Int. Symp. Microarchitecture, Dec. 2011, pp. 1-28.
J. Davis, et al., "A 5.6GHz 64KB Dual-Read Data Cache for the POWER6TM Processor," IEEE ISSCC Dig. Tech. Papers, Feb. 2006, pp. 2564-2571.
J. Pille, et al., "Implementation of the Cell Broadband Engine in 65 nm SOI Technology Featuring Dual Power Supply SRAM Arrays Supporting 6 GHz at 1.3 V," IEEE J. Solid-State Circuits, vol. 43, No. 1, pp. 163-171, Jan. 2008.
J. Samandari-Rad, et al., "Power/Energy Minimization Techniques for Variability-Aware High-Performance 16-nm ST-SRAM," IEEE Access, vol. 4, pp. 594-613, 2016.
M. Clinton, et al., "12.3 A Low-Power and High-Performance 10nm SRAM Architecture for Mobile Applications," IEEE ISSCC Dig. Tech. Papers, Feb. 2017, pp. 210-211.

(Continued)

*Primary Examiner* — Son T Dinh
(74) *Attorney, Agent, or Firm* — Davenport IP Law, PLLC

(57) ABSTRACT

An example described herein is a circuit including a dynamic complementary metal-oxide-semiconductor (CMOS) inverter level translator circuit and a capacitor. The dynamic CMOS inverter level translator circuit is electrically connected to a first power domain and has a first input node configured to receive a first trigger signal generated in the first power domain. The dynamic CMOS inverter level translator circuit has a second input node configured to receive a second trigger signal generated in a second power domain different from the first power domain. The capacitor is electrically coupled to an output node of the dynamic CMOS inverter level translator circuit. The capacitor selectively charges to the first power domain through the dynamic CMOS inverter level translator circuit based on the first trigger signal. The capacitor selectively discharges to provide a negative coupling voltage to a write assist supply node.

20 Claims, 9 Drawing Sheets

(56) References Cited

OTHER PUBLICATIONS

M. Ling, et al., "Lowering the Hit Latencies of Low Voltage Caches Based on the Cross-Sensing Timing Speculation SRAM," IEEE Access, vol. 7, pp. 111649-111661, 2019.

M. Powell, et al., "Gated-Vdd: A Circuit Technique to Reduce Leakage in Deep-Submicron Cache Memories," Proc. Int. Symp. Low Power Electron. Design ISLPED, 2000, pp. 90-95.

M. S. M. Siddiqui, et al., "A 16-kb 9T Ultralow-Voltage SRAM With Column-Based Split Cell-VSS, Data-Aware Write-Assist, and Enhanced Read Sensing Margin in 28-nm FDSOI," IEEE Transactions on Very Large Scale Integration (VLSI) Systems, vol. 29, No. 10, pp. 1707-1719, Oct. 2021, doi: 10.1109/TVLSI.2021.3102675.

M. S. M. Siddiqui, et al., "A 7-Nm Dual Port 8T SRAM with Duplicated Inter-Port Write Data to Mitigate Write Disturbance," 2018 31st International Conference on VLSI Design and 2018 17th International Conference on Embedded Systems (VLSID), 2018, pp. 266-270, doi: 10.1109/VLSID.2018.74.

M. S. M. Siddiqui, et al., "Two Phase Write Scheme to Improve Low Voltage Write-Ability in Medium-Density SRAMs," 2015 28th International Conference on VLSI Design, 2015, pp. 176-180, doi: 10.1109/VLSID.2015.35.

P. Singh, et al., "Ultra-Low Power High Stability 8T SRAM for Application in Object Tracking System," IEEE Access, vol. 6, pp. 2279-2290, 2018.

R. Joshi, et al., "A Low Power and High Performance Soi Sram Circuit Design with Improved Cell Stability," Proc. IEEE Int. SOI Conf., Oct. 2006, pp. 4-7.

T. H. Kim, et al., "An Embedded Level-Shifting Dual-Rail SRAM for High-Speed and Low-Power Cache," IEEE Access, vol. 8, pp. 187126-187139, 2020, doi: 10.1109/ACCESS.2020.3030099.

Y. H. Chen, et al., "A 0.6 V Dual-Rail Compiler SRAM Design on 45 nm CMOS Technology With Adaptive SRAM Power for Lower VDD_min VLSIs," IEEE J. Solid-State Circuits, vol. 44, No. 4, pp. 1209-1215, Apr. 2009.

\* cited by examiner

MEMORY WRITE ASSIST

TECHNICAL FIELD

The present disclosure relates to memory systems, and more particularly, to write assist in memory systems.

BACKGROUND

A number of different memory technologies have been developed. One such technology is static random access memory (SRAM). SRAM is ubiquitous in modern electronics. Although various configurations of a bit cell of SRAM may be implemented, one of them is a six transistor (6T) configuration.

SUMMARY

An example described herein is a circuit. The circuit includes a dynamic complementary metal-oxide-semiconductor (CMOS) inverter level translator circuit and a capacitor. The dynamic CMOS inverter level translator circuit is electrically connected to a first power domain. The dynamic CMOS inverter level translator circuit has a first input node configured to receive a first trigger signal generated in the first power domain. The dynamic CMOS inverter level translator circuit has a second input node configured to receive a second trigger signal generated in a second power domain different from the first power domain. The capacitor is electrically coupled to an output node of the dynamic CMOS inverter level translator circuit. The capacitor selectively charges to the first power domain through the dynamic CMOS inverter level translator circuit based on the first trigger signal. The capacitor selectively discharges to provide a negative coupling voltage to a write assist supply node. The write assist supply node is electrically coupled to a negative supply node of a bit line driver circuit of a memory array.

Another example described herein is a method. A first trigger signal is received by a dynamic CMOS inverter level translator circuit. The first trigger signal is generated in a first power domain. A voltage of a capacitor is charged to the first power domain through the dynamic CMOS inverter level translator circuit. The dynamic CMOS inverter level translator circuit is electrically coupled to the first power domain. A second trigger signal is received by the dynamic CMOS inverter level translator circuit. The second trigger signal is generated in a second power domain that is different from the first power domain. The voltage of the capacitor is discharged through the dynamic CMOS inverter level translator circuit based on the first trigger signal and the second trigger signal.

A further example described herein is a non-transitory storage medium storing an electronic representation of a design. The design includes a write assist circuit. The write assist circuit includes a dynamic CMOS inverter level translator circuit and a capacitor. The dynamic CMOS inverter level translator circuit is electrically connected to a first power domain. The dynamic CMOS inverter level translator circuit has a first input node configured to receive a first trigger signal generated in the first power domain. The dynamic CMOS inverter level translator circuit has a second input node configured to receive a second trigger signal generated in a second power domain different from the first power domain. The capacitor is electrically coupled to an output node of the dynamic CMOS inverter level translator circuit. The capacitor selectively charges to the first power domain through the dynamic CMOS inverter level translator circuit based on the first trigger signal. The capacitor selectively discharges to provide a negative coupling voltage to a write assist supply node. The write assist supply node is electrically coupled to a negative supply node of a bit line driver circuit of a memory array.

BRIEF DESCRIPTION OF THE DRAWINGS

The disclosure will be understood more fully from the detailed description given below and from the accompanying figures of examples of the disclosure. The figures are used to provide knowledge and understanding of examples of the disclosure and do not limit the scope of the disclosure to these specific examples. Furthermore, the figures are not necessarily drawn to scale.

DETAILED DESCRIPTION

Figure 1A:
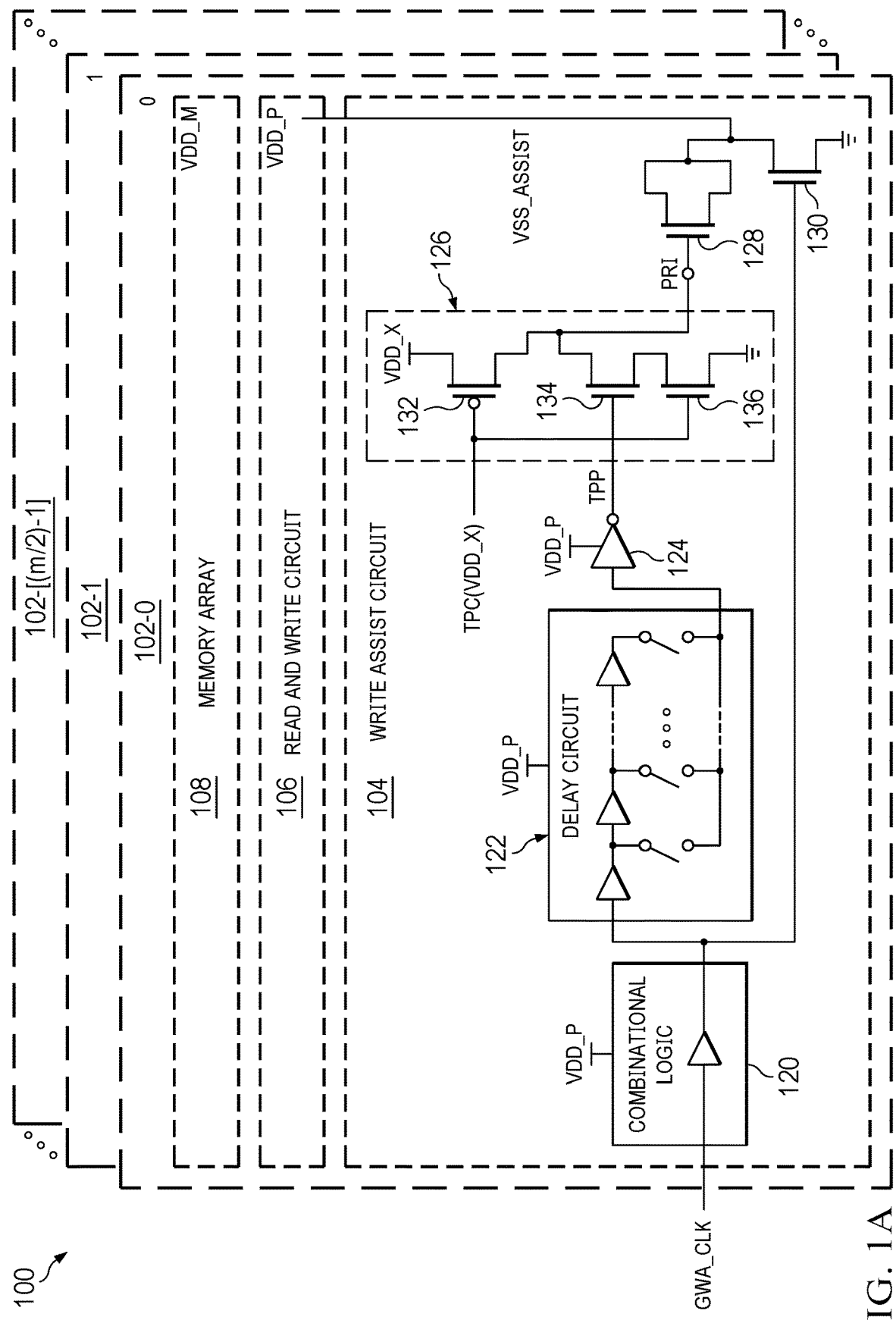
FIGS. 1A and 1B illustrate a circuit schematic of a memory system according to some examples.

Aspects of the present disclosure relate to memory write assist. Static random access memory (SRAM) may include a memory array and peripheral circuits such as a write assist circuit and a read and write circuit. The memory array uses complementary signals on a bit line node and a complementary bit line node to write to a given bit cell. For example, a six transistor (6T) SRAM bit cell includes two cross-coupled inverters. The input node of one inverter is electrically connected to the output node of the other inverter as a storage node, and vice versa as a complementary storage node. The 6T SRAM bit cell includes two pass gate transistors. One pass gate transistor has source and drain nodes electrically connected between a bit line node and the storage node, and the other pass gate transistor has source and drain nodes electrically connected between a complementary bit line node and the complementary storage node. A write line node is electrically coupled to the gate nodes of the pass gate transistors. Generally, in a write operation, the bit line and complementary bit line are driven to complementary logical values corresponding to data to be written to the 6T SRAM bit cell. A signal on the word line node is asserted allowing the complementary logical values to pass through the pass gate transistors to the storage node and the complementary storage node. The cross-coupled inverters latch and store these complementary logical values.

Hence, generally, during a write operation, either the signal on the bit line node or on the complementary bit line node is logically low, which is implemented by a low voltage (e.g., 0 V). To lower power consumption in the SRAM bit cells of the memory array and the peripheral circuits, positive supply voltages of such circuits have been reduced. In some instances, the power domain for the SRAM bit cells has generally been separated from the power domain of the peripheral circuits permitting the positive supply voltages of the power domains to be reduced by different amounts. Such reduction in positive supply voltages of the memory array and the peripheral circuits have led to increased importance on negative bit line (NBL) specifications and static noise margin (SNM).

Due to the decreased positive supply voltages, NBL specifications address a voltage of a logically low signal on a bit line node or complementary bit line node to help ensure data is properly written to a bit cell. As the positive supply voltage of the power domain of the bit cell decreases, a low voltage for a logically low signal on a bit line node or complementary bit line node to cause a pass gate transistor to conduct the logically low signal to the cross-coupled inverters of the bit cell should decrease. Stated differently, the NBL specification of the bit cell increases (e.g., a magnitude of the negative voltage increases) as the positive supply voltage decreases. The increasing NBL specification also helps ensure a sufficient voltage differential between the bit line node and complementary bit line node to satisfy the write margin for writing data properly to the bit cell.

A write assist circuit can be implemented to effectuate the NBL specification. A write assist circuit can apply a negative voltage to a negative supply node of a driver circuit in a read and write circuit that drives a bit line node or complementary bit line node going to a memory array. The negative voltage can be generated by (i) first charging a capacitance with a given polarity with reference to a ground node and (ii) by using switching elements (such as transistors), reversing the polarity of the capacitance with reference to a ground node, where the terminal of the capacitance opposite to the ground node is coupled to the node on which the negative voltage is applied. When a negative voltage is applied to the negative supply node, the driver circuit can drive a logically low signal to the negative voltage of the negative supply node. The magnitude of the negative voltage that a write assist circuit may supply is proportional to the positive supply voltage of the power domain that the write assist circuit uses to generate the negative voltage.

Together, the reduced positive supply voltage of the bit cells (that leads to an increased NBL specification) and the reduced positive supply voltage of a write assist circuit (which leads to a reduced proportional magnitude of a negative voltage) may be a limitation to further reduction of positive supply voltage of one or both of the power domains of the bit cells in the memory array and peripheral circuits. This can be a barrier to further reductions in power consumption and leakage current.

Various examples described herein address these challenges. Generally, a write assist circuit includes a dynamic complementary metal-oxide-semiconductor (CMOS) inverter level translator that is configured to operate in a power domain different from generally the power domain of other components of the write assist circuit. The power domain in which the CMOS inverter level translator is configured to operate may be the memory power domain of the bit cells (herein, "memory power domain") or a separate power domain (herein, "write assist power domain"). During a precharge phase, a coupling capacitance of the write assist circuit, which is coupled to a write assist supply node, is charged proportionally to the positive supply voltage of the given power domain (e.g., the memory power domain or the write assist power domain) through the dynamic CMOS inverter level translator. Then, in an evaluation phase, the voltage of the coupling capacitance is discharged, which induces a negative voltage to a capacitively coupled write assist supply node. The write assist supply node is electrically connected to a negative supply node of a bit line driver circuit. Other components in the write assist circuit or other peripheral circuit, such as a read and write circuit, may operate in a power domain (herein, "processor power domain") different from the memory power domain or write assist power domain. With the positive supply voltage of the memory or write assist power domain being used for the write assist, the positive supply voltage of the processor power domain may be further reduced without adversely impacting the NBL specification or SNM of the bit cells. Other or different advantages or benefits may be achieved in various examples.

Various examples illustrated in the figures and described subsequently implement and operate based on various polarities of signals. A polarity of any signal may be changed (e.g., inverted), and a person having ordinary skill in the art will readily understand how circuits described herein would be modified to implement such change of polarity. Additionally, other logic can be implemented in other examples, and a person of ordinary skill in the art will readily understand such implementations.

Figure 1B:
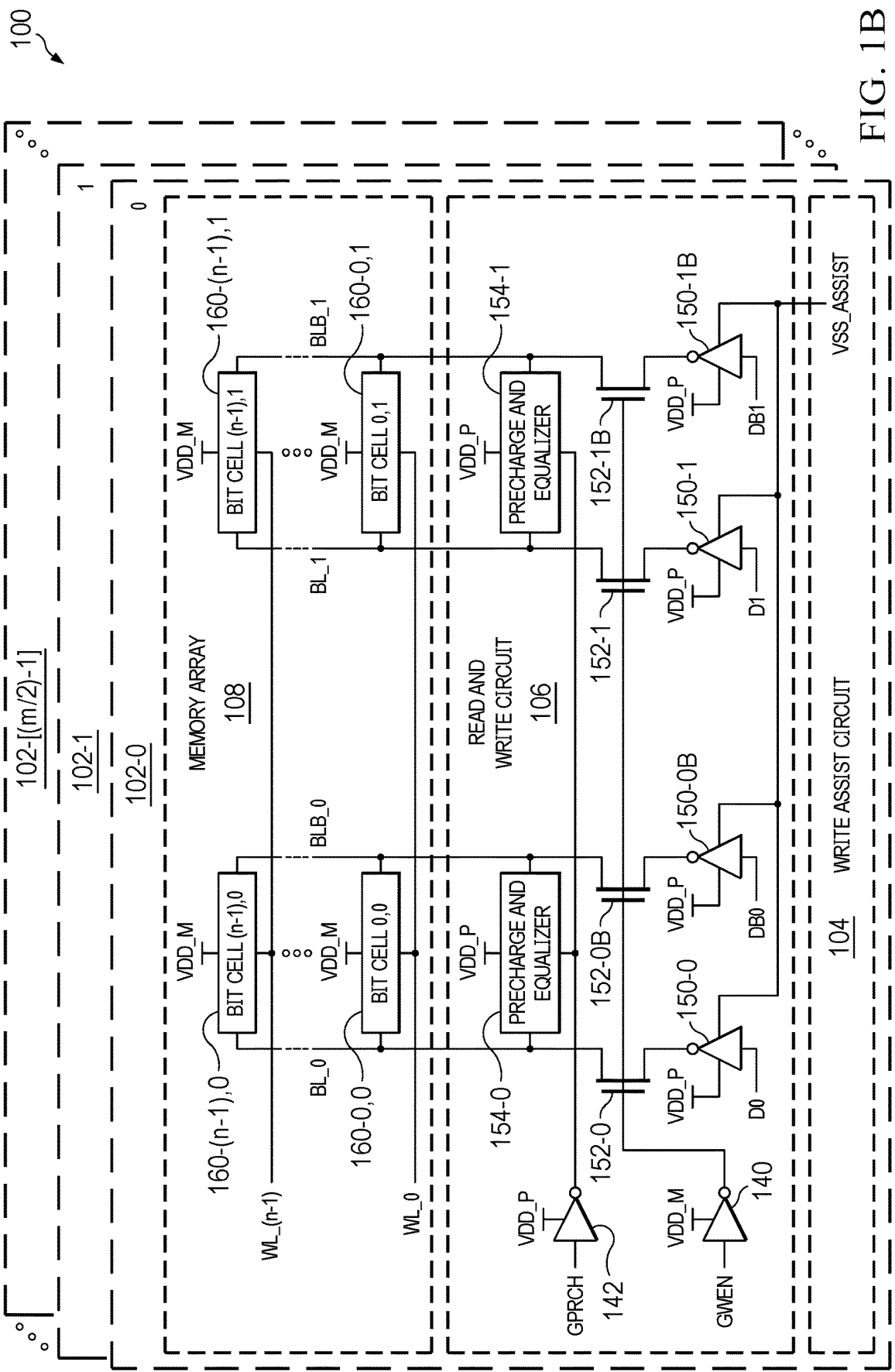

FIGS. 1A and 1B illustrate a circuit schematic of a memory system 100 according to some examples. The memory system 100 includes (m/2) pages 102-0, 102-1, . . . 102-[(m/2)−1] (collectively or individually, page(s) 102). Each page 102 includes a write assist circuit 104, a read and write circuit 106, and a memory array 108. In various illustrated examples, the write assist circuit 104, read and write circuit 106, and memory array 108 of one arbitrary page 102 is shown and described for clarity and to avoid obscuring various aspects, and such illustration and description may be applied for multiple (e.g., each) pages 102 in the memory system 100. As described in detail subsequently, the memory array 108 includes two columns of n rows of memory bit cells. Hence, the memory system 100 may be or include an (n×m) array of memory bit cells, such as a 256×256 array of memory bit cells. In some examples, the memory bit cells may be SRAM bit cells. In some examples, the memory system 100 may be a dual rail high density (HD) SRAM.

Generally, the memory array 108 is configured to operate in a memory power domain (with a memory positive supply voltage (VDD_M)), and the read & write circuit is configured to operate in a processor power domain (with a processor positive supply voltage (VDD_P)). Some components in the write assist circuit 104 are configured to operate in the processor power domain, and other components in the write assist circuit 104 are configured to operate in a desired charging power domain, such as components that generate a write assist supply voltage (VSS_ASSIST). The desired charging power domain has a desired charging positive supply voltage (VDD_X). The desired charging power domain, in some examples, may be the memory power domain or an independent write assist power domain (with a write assist positive supply voltage (VDD_WA)). In some examples, the memory positive supply voltage (VDD_M) is greater than the processor positive supply voltage (VDD_P). In some examples, the write assist positive supply voltage (VDD_WA) is different from (e.g., greater than) both the memory positive supply voltage (VDD_M) and the processor positive supply voltage (VDD_P).

Referring to FIG. 1A, the write assist circuit 104 includes combinational logic 120, a delay circuit 122, an inverter 124, a dynamic CMOS inverter level translator 126, a first n-type field effect transistor (nFET) 128, and a second nFET 130. The combinational logic 120 may be or include a buffer or other circuitry such as a Boolean circuit (e.g., an AND gate, a NOR gate, an XOR gate) to drive a signal input into the combinational logic 120. The delay circuit 122 may include a chain of buffers, which may further be configured to have output taps that may be selectively connected to an output node of the delay circuit 122 such that the delay circuit 122 may be programmable. Other circuits may be implemented as the delay circuit 122, which may be static or non-programmable in other examples. The dynamic CMOS inverter level translator 126 includes, in the illustrated example, a p-type field effect transistor (pFET) 132, a third nFET 134, and a fourth nFET 136. The pFET 132 and the nFETs 128, 130, 134, 136 may each be a respective metal-oxide-semiconductor (MOS) transistor.

The combinational logic 120, the delay circuit 122, and the inverter 124 are configured to operate in the processor power domain. Hence, the combinational logic 120, the delay circuit 122, and the inverter 124 are each electrically connected to a positive supply node on which the processor positive supply voltage (VDD_P) is provided. The dynamic CMOS inverter level translator 126 is configured to operate in the desired charging power domain. Hence, the dynamic CMOS inverter level translator 126 is electrically connected to a positive supply node on which the desired charging positive supply voltage (VDD_X) is provided. For ease of description, VDD_P may be used in reference to the processor positive supply voltage or a positive supply node on which the processor positive supply voltage is provided (e.g., processor positive supply node): VDD_M may be used in reference to the memory positive supply voltage or a positive supply node on which the memory positive supply voltage is provided (e.g., memory positive supply node); etc. Description of corresponding signals/voltages and nodes may follow this nomenclature.

The combinational logic 120 has an input node electrically connected to a global write assist clock (GWA_CLK) node. The combinational logic 120 is configured to receive a GWA_CLK signal on the input node electrically connected to the GWA_CLK node. The GWA_CLK signal controls, at least in part, a precharge phase and an evaluation phase for the dynamic CMOS inverter level translator 126. The combinational logic 120 has an output node electrically connected to an input node of the delay circuit 122 and to a gate node of the second nFET 130. The combinational logic 120 is configured to drive the GWA_CLK signal to the output node of the combinational logic 120 and correspondingly to the input node of the delay circuit 122 and the gate node of the second nFET 130.

An output node of the delay circuit 122 is electrically connected to an input node of the inverter 124. The delay circuit 122 is configured to delay the propagation of the GWA_CLK signal received at the input node of the delay circuit 122 to the output node of the delay circuit 122 by an amount of time. The amount of time may be based on a time for settling of a voltage to a logically low state on a bit line node for writing to a bit cell in the memory array 108.

The inverter 124 has an output node that is a processor primary trigger node (TPP). The processor primary trigger node (TPP) is electrically connected to a first input node of the dynamic CMOS inverter level translator 126, which, as illustrated, is a gate node of the third nFET 134. The inverter 124 is configured to logically invert the delayed global write assist signal received on the input node of the inverter 124 and to output the logically inverted signal as a processor primary trigger signal (TPP) on the processor primary trigger node (TPP). The processor primary trigger node (TPP) is configured to receive a signal generated in the processor power domain, such as from the delay circuit 122, and the processor primary trigger signal (TPP) operates in the processor power domain.

The dynamic CMOS inverter level translator 126 has a second input node electrically connected to a charging primary trigger node (TPC). The second input node of the dynamic CMOS inverter level translator 126 is the respective gate nodes of the pFET 132 and the fourth nFET 136 electrically connected together. A charging primary trigger signal (TPC) is provided on the charging primary trigger node (TPC). The charging primary trigger node (TPC) is configured to receive a signal generated in the desired charging power domain, and the charging primary trigger signal (TPC) operates in the desired charging power domain. Therefore, the charging primary trigger node (TPC) is shown to be dependent on the desired charging positive supply voltage (VDD_X).

In the dynamic CMOS inverter level translator 126, a source node of the pFET 132 is electrically coupled to a desired charging positive supply node (VDD_X). A drain node of the pFET 132 is electrically connected to a drain node of the third nFET 134. A source node of the third nFET 134 is electrically connected to a drain node of the fourth nFET 136. A source node of the fourth nFET 136 is electrically connected to a ground node. The electrically connected drain nodes of the pFET 132 and third nFET 134 are further electrically connected to a gate node of the first nFET 128, which is designated a primary node (PRI). The electrically connected drain nodes of the pFET 132 and third nFET 134 may be referred to as an output node of the dynamic CMOS inverter level translator 126.

Table 1 below summarizes the general operation of the dynamic CMOS inverter level translator 126. As indicated previously, the charging primary trigger signal (TPC) is in the desired charging power domain (e.g., which may be the memory power domain or the write assist power domain). When the charging primary trigger signal (TPC) is at a ground or low voltage (e.g., TPC='0'), the dynamic CMOS inverter level translator 126 outputs the desired charging positive supply voltage (VDD_X) on the primary node (PRI), which may be in a primary precharge phase described subsequently, and which may be regardless of the state of the processor primary trigger signal (TPP) (e.g., TPP='X' or do not care). In this circumstance, the pFET 132 is closed, and the fourth nFET 136 is open, which pulls the primary node (PRI) high to the desired charging positive supply voltage (VDD_X). When the charging primary trigger signal (TPC) is at the desired charging positive supply voltage (VDD_X) (e.g., TPC='1'), the dynamic CMOS inverter level translator 126 is in a primary evaluation phase with two possible events. During a first event, when the processor primary trigger signal (TPP) is at the processor positive supply voltage (VDD_P) (e.g., TPP='1'), the dynamic CMOS inverter level translator 126 pulls the primary node (PRI) to a ground voltage (e.g., PRI='0'). In this circumstance, the pFET 132 is open, and the third nFET 134 and fourth nFET 136 are closed, which pulls the primary node (PRI) low to ground. During a second event, when the processor primary trigger signal (TPP) is at a ground or low voltage (e.g., TPP='0'), the dynamic CMOS inverter level translator 126 holds the primary node (PRI) to at the desired charging positive supply voltage (VDD_X) in a floating state (e.g., PRI='1'). In this circumstance, the pFET 132 and the third nFET 134 are open, which holds the primary node (PRI) at a floating state (e.g., not driven).

TABLE 1

| TPC (VDD_X) | TPP (VDD_P) | PRI (VDD_X) |
|---|---|---|
| 0 | X | 1 |
| 1 | 1 | 0 |
| 1 | 0 | 1 |

A drain node and a source node of the first nFET 128 are electrically connected together and to a write assist supply node (VSS_ASSIST). In this example, the first nFET 128 is configured as a capacitor (e.g., a MOS capacitor). Another type of capacitor can be implemented instead of the first nFET 128. The first nFET 128 may operate as a direct current (DC) isolation capacitor and as a coupling capacitor between primary node (PRI) and write assist supply node (VSS_ASSIST). The drain and source nodes of the first nFET 128 (e.g., the write assist supply node (VSS_ASSIST)) is further electrically connected to a drain node of the second nFET 130, and a source node of the second nFET 130 is electrically connected to a ground node.

The write assist circuit 104, in the illustrated example, includes a parasitic capacitance at the primary node (PRI). This parasitic capacitance may be formed from a combination of metal lines or features and/or one or more doped regions in the semiconductor substrate on which the memory system 100 is fabricated. The parasitic capacitance may be included in the capacitance that is to be charged and discharged in a primary precharge phase and a primary evaluation phase described subsequently. In other examples, a structured capacitor may be formed at the primary node (PRI), such as a parallel plate capacitor, a MOS capacitor, or the like.

Referring to FIG. 1B, the read and write circuit 106 is illustrated including a write circuit, and a read circuit is omitted to avoid obscuring various aspects described herein. The read and write circuit 106 includes inverters 140, 142, 150-0, 150-0B, 150-1, 150-1B, nFETs 152-0, 152-0B, 152-1, 152-1B, and precharge and equalizer circuits 154-0, 154-1. As a general note, any reference number appended with "-0" is in or associated with a first column in the read and write circuit 106, and any reference number appended with "-1" is in or associated with a first column in the read and write circuit 106. Further, any reference number appended with "B" is a configured to be complementary of a corresponding component within the same column.

The inverter 140 is configured to operate in the memory power domain. Hence, the inverter 140 is electrically connected to a memory positive supply node (VDD_M). The inverter 142 and precharge and equalizer circuits 154-0, 154-1 are configured to operate in the processor power domain. Hence, the inverter 142 and precharge and equalizer circuits 154-0, 154-1 are each electrically connected to a processor positive supply node (VDD_P). The inverters 150-0, 150-0B, 150-1, 150-1B are electrically connected to the processor positive supply node (VDD_P) and to the write assist supply node (VSS_ASSIST). Hence, the inverters 150-0, 150-0B, 150-1, 150-1B are configured to operate between the processor positive supply voltage (VDD_P) and the voltage on the write assist supply node (VSS_ASSIST).

An input node of the inverter 140 is electrically connected to a global write enable node (GWEN), and an output node of the inverter 140 is electrically connected to the gate nodes of the nFETs 152-0, 152-0B, 152-1, 152-1B. An input node of the inverter 142 is electrically connected to a global precharge trigger node (GPRCH), and an output node of the inverter 142 is electrically connected to respective input nodes of the precharge and equalizer circuits 154-0, 154-1.

An input node of the inverter 150-0 is electrically connected to a first data node (D0), and an output node of the inverter 150-0 is electrically connected to a drain/source node of the nFET 152-0. A source/drain node of the nFET 152-0 is electrically connected to a first bit line node (BL_0). An input node of the inverter 150-0B is electrically connected to a complementary first data node (DB0), and an output node of the inverter 150-0B is electrically connected to a drain/source node of the nFET 152-0B. A source/drain node of the nFET 152-0B is electrically connected to a complementary first bit line node (BLB_0). The precharge and equalizer circuit 154-0 is electrically connected between the first bit line node (BL_0) and the complementary first bit line node (BLB_0).

An input node of the inverter 150-1 is electrically connected to a second data node (D1), and an output node of the inverter 150-1 is electrically connected to a drain/source node of the nFET 152-1. A source/drain node of the nFET 152-1 is electrically connected to a second bit line node (BL_1). An input node of the inverter 150-1B is electrically connected to a complementary second data node (DB1), and an output node of the inverter 150-1B is electrically connected to a drain/source node of the nFET 152-1B. A source/drain node of the nFET 152-1B is electrically connected to a complementary second bit line node (BLB_1). The precharge and equalizer circuit 154-1 is electrically connected between the second bit line node (BL_1) and the complementary second bit line node (BLB_1).

The inverters 140, 142, 150-0, 150-0B, 150-1, 150-1B are configured to invert a signal received on an input node of the respective inverter and to output and drive the inverted signal on an output node of the respective inverter. Hence, the inverters 150-0, 150-0B, 150-1, 150-1B may be referred to as respective bit line data driver circuits. In other examples, any of the inverters 140, 142, 150-0, 150-0B, 150-1, 150-1B may be implemented with another driver circuit, such as a buffer. The logical polarity change of signals may be also modified.

The memory array 108 includes (n×2) bit cells 160-0,0, 160-0,1, ... 160-(n-1),0, 160-(n-1), 1 (collectively or individual, bit cell(s) 160). As a general note, each bit cell 160 has reference number that is appended with "-i,j" notation, where i is the row number of the respective bit cell 160, and j is the column number of the respective bit cell 160. The bit cells 160 are each configured to operate in the memory power domain. Hence, the bit cells 160 are each electrically connected to a memory positive supply node (VDD_M). Bit cells 160-x,0 in the first column are each electrically connected between the first bit line node (BL_0) and the complementary first bit line node (BLB_0). Bit cells 160-x,1 in the second column are each electrically connected between the second bit line node (BL_1) and the complementary second bit line node (BLB_1). Bit cells 160-(k-1),y in a given row k are each electrically connected to a (k-1) word line node (WL_(k-1)) (e.g., WL_0 through WL_(n-1))). Each bit cell 160, in the illustrated example, may have a six transistor SRAM configuration.

Figure 2:
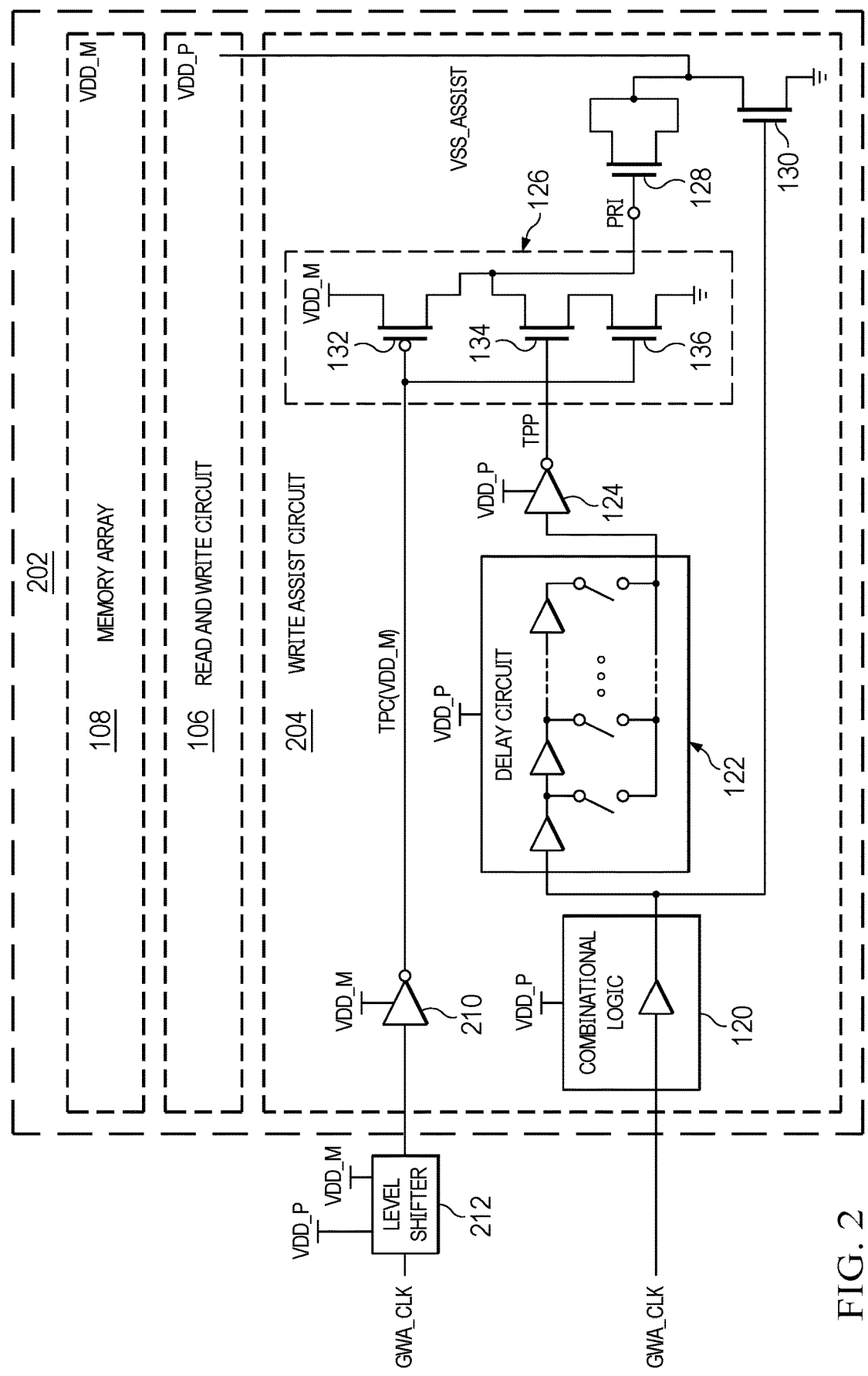
FIG. 2 illustrates a schematic of a page of a memory system according to some examples.

FIG. 2 illustrates a schematic of a page 202 of a memory system according to some examples. The page 202 may be implemented for one or more of the pages 102 of the memory system 100 of FIGS. 1A and 1B. The page 202 includes a write assist circuit 204, a read and write circuit 106, and a memory array 108. The write assist circuit 204 illustrates a more detailed implementation for generating the charging primary trigger signal (TPC). In this example, the desired charging power domain (e.g., the desired charging positive supply voltage (VDD_X)) is the memory power domain (e.g., the memory positive supply voltage (VDD_M)).

The write assist circuit 204 includes components as illustrated in and described with respect to the write assist circuit 104 in FIG. 1A and further includes an inverter 210. In some examples, the inverter 210 may be outside of the write assist circuit 204 (and hence, the write assist circuit 204 would not include the inverter 210). The inverter 210 is electrically connected to the memory power domain (and hence, a memory positive supply node (VDD_M)). An output node of the inverter 210 is electrically connected to the charging primary trigger node (TPC). An input node of the inverter 210 is electrically connected to an output node of a level shifter circuit 212, which may be outside of the write assist circuit 204. The level shifter circuit 212 has an input node that is electrically connected to the global write assist clock node (GWA_CLK). The level shifter circuit 212 is electrically connected to both the processor power domain (and hence, a processor positive supply node (VDD_P)) and the memory power domain (and hence, a memory positive supply node (VDD_M)). The level shifter circuit 212 is configured to receive the global write assist clock signal (GWA_CLK) from the global write assist clock node (GWA_CLK), which is in the processor power domain, and level shift the global write assist clock signal (GWA_CLK) to the memory power domain. The inverter 210 is configured to receive and invert the level shifted global write assist clock signal (GWA_CLK) and output the inverted level shifted global write assist clock signal as the charging primary trigger signal (TPC) to the charging primary trigger node (TPC).

Figure 3:
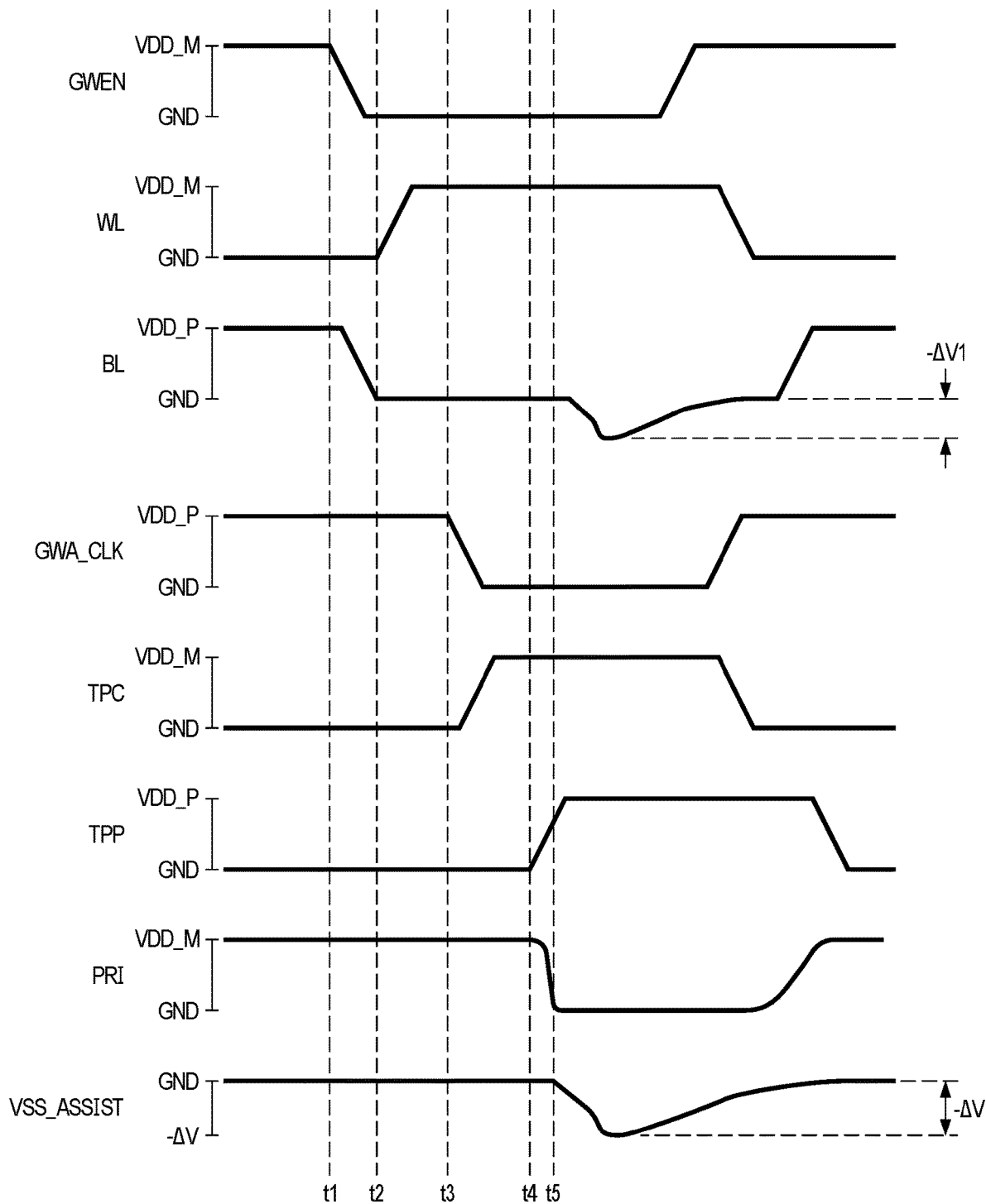
FIG. 3 is a timing graph of signals illustrating operation of a memory system that includes the pages of FIG. 2 according to some examples.

FIG. 3 is a timing graph of signals illustrating operation of a memory system 100 that includes the pages 202 of FIG. 2 according to some examples. FIG. 3 illustrates the global write enable signal (GWEN), an arbitrary word line signal (WL), an arbitrary bit line signal (BL), the global write assist clock signal (GWA_CLK), the charging primary trigger signal (TPC), the processor primary trigger signal (TPP), the primary node voltage (PRI), and the write assist supply voltage (VSS_ASSIST). The polarity of the signals shown in FIG. 3 may be inverted in other examples, and the page 202 may be modified to accommodate any change of polarity of one or more signals.

At time t1, the global write enable signal (GWEN) has a falling edge (e.g., transitioning from logically high to logically low) that indicates initiation of a write operation, and the bit line signal (BL) has a falling edge. At time t2, the word line signal (WL) has a rising edge (e.g., transitioning from logically low to logically high). Global circuitry monitors for the falling edge of the bit line signal (BL), and in response to detecting the falling edge of the bit line signal (BL), that global circuitry causes the global write assist clock signal (GWA_CLK) to transition to logically low by a falling edge at time t3 (e.g., some amount of time subsequent to time t2).

During the time up to time t3, the write assist circuit 204 is in a primary precharge phase. The second nFET 130 and the pFET 132 are in closed (e.g., conducting) states due to the global write assist clock signal (GWA_CLK) being logically high and the charging primary trigger signal (TPC) being logically low, respectively, and the fourth nFET 136 is in an open state due to the charging primary trigger signal (TPC) being logically low. Because the second nFET 130 is closed, the write assist supply node (VSS_ASSIST) is coupled to a ground node through the second nFET 130 (e.g., the write assist supply voltage (VSS_ASSIST) is or is approximately the ground voltage). With the pFET 132 closed and the fourth nFET 136 open, the capacitance at the primary node (PRI) (e.g., including the capacitance of the first nFET 128, which may be configured as a MOS capacitor) charges to the memory positive supply voltage (VDD_M). Hence, the primary node voltage (PRI) is high at the memory positive supply voltage (VDD_M) up to time t3. Note, FIG. 3 does not indicate the beginning of the primary precharge phase, so a rise of the charge of the primary node (PRI) is not shown in the precharge phase up to time t3. The first nFET 128 may act as a DC isolation MOS capacitor between the write assist supply node (VSS_ASSIST) and the primary node (PRI).

At time t3, the falling edge of the global write assist clock signal (GWA_CLK) causes the charging primary trigger signal (TPC) to have a rising edge, possibly with some delay relative to the falling edge of the global write assist clock signal (GWA_CLK) due to latency of the level shifter circuit 212 and inverter 210. At time t4, the falling edge of the global write assist clock signal (GWA_CLK) causes the processor primary trigger signal (TPP) to have a rising edge. The delay between time t3 and time t4 includes delay resulting from the propagation of the global write assist clock signal (GWA_CLK) through the delay circuit 122. This delay from the delay circuit 122 may permit the bit line signal (BL) to settle following the falling edge of the bit line signal (BL) at time t1.

At time t3, the write assist circuit 204 enters into a primary evaluation phase. The second nFET 130 is in an open state due to the global write assist clock signal (GWA_CLK) being logically low, and the pFET 132 and the fourth nFET 136 are in an opened state and a closed state, respectively, due to the charging primary trigger signal (TPC) being logically high. Further, at time t3, the third nFET 134 is in an open state due to the processor primary trigger signal (TPP) being logically low. Hence, at time t3 to time t4, the write assist supply node (VSS_ASSIST) is in a floating state decoupled from a ground node, and the primary node (PRI) is also not being driven and is in a floating state.

At time t5 following time t4, the rising edge of the processor primary trigger signal (TPP) causes the third nFET 134 to become in a closed state. The closed state of the third nFET 134 causes the discharge of the capacitance at the primary node (PRI) (e.g., including the capacitance of the first nFET 128, which may be configured as a MOS capacitor), and a negative voltage (e.g., −ΔV) is coupled to the write assist supply node (VSS_ASSIST) through the first nFET 128, and hence, on the bit line node (BL) as the bit line signal (BL) through an inverter 150. The closing of the third nFET 134, with the fourth nFET 136 also being closed, causes the primary node (PRI) to be electrically coupled to a ground node, and hence, the primary node voltage (PRI) drops to a ground voltage.

Subsequent to time t5, the global write assist clock signal (GWA_CLK) has a rising edge, and the charging primary trigger signal (TPC) responsively has a falling edge. With the global write assist clock signal (GWA_CLK) and the charging primary trigger signal (TPC) being logically high and logically low, respectively, the write assist circuit 204 enters into another primary precharge phase. At the onset of the primary precharge phase, the capacitance at the primary node (PRI) charges to the memory positive supply voltage (VDD_M) based on the resistance-capacitance (RC) time constant of the circuit.

Figure 4:
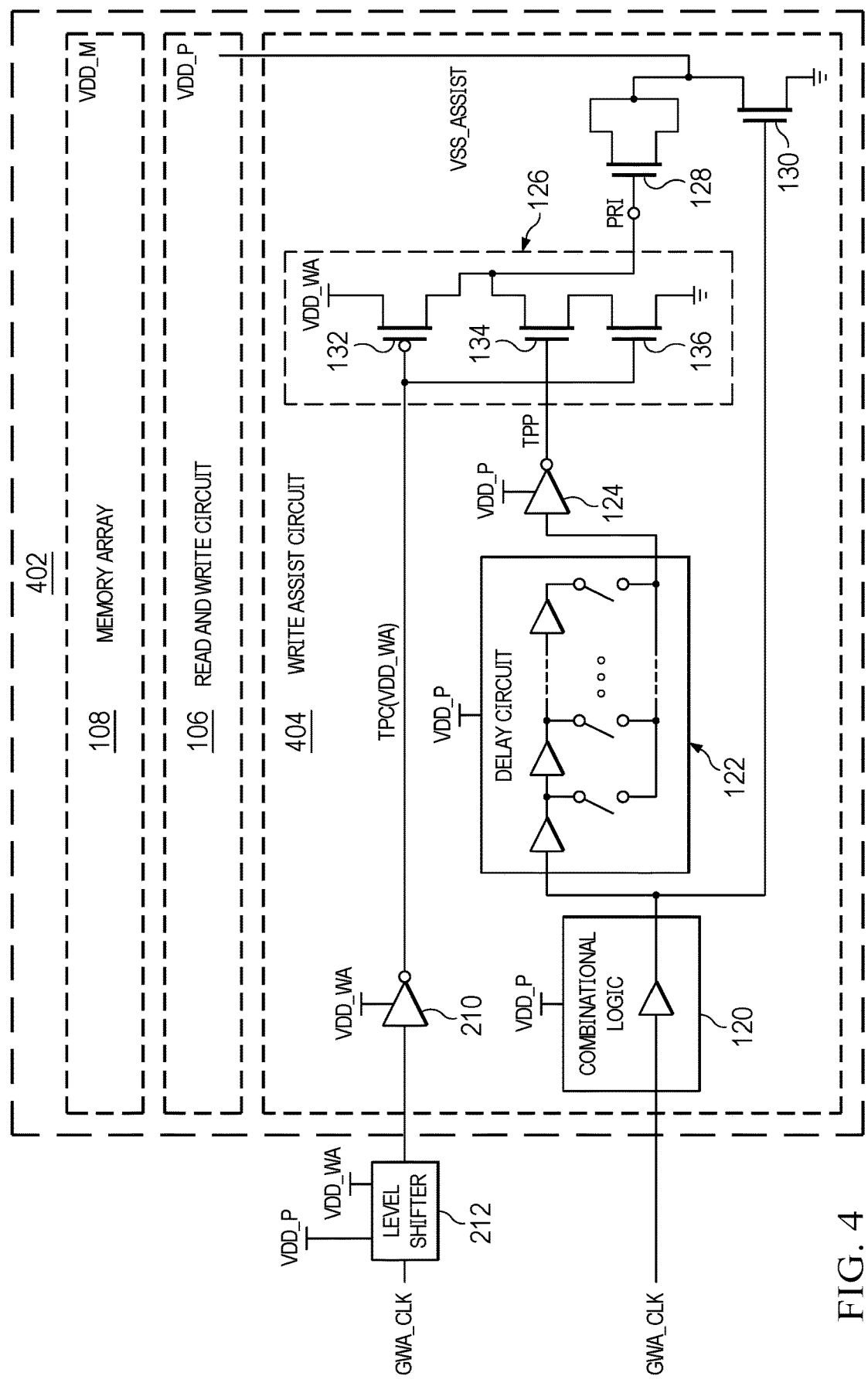
FIG. 4 illustrates a schematic of a page of a memory system according to some examples.

FIG. 4 illustrates a schematic of a page 402 of a memory system according to some examples. The page 402 may be implemented for one or more of the pages 102 of the memory system 100 of FIGS. 1A and 1B. The page 402 includes a write assist circuit 404, a read and write circuit 106, and a memory array 108. The write assist circuit 404 is implemented like the write assist circuit 204 of FIG. 2, except that the desired charging power domain (e.g., the desired charging positive supply voltage (VDD_X)) is a write assist power domain (e.g., the write assist positive supply voltage (VDD_WA)).

The write assist circuit 404 includes components as illustrated in and described with respect to the write assist circuit 204 in FIG. 2. The inverter 210 is electrically connected to the write assist power domain (and hence, a write assist positive supply node (VDD_WA)). The level shifter circuit 212 is electrically connected to both the processor power domain (and hence, a processor positive supply node (VDD_P)) and the write assist power domain (and hence, a write assist positive supply node (VDD_WA)). The level shifter circuit 212 is configured to receive the global write assist clock signal (GWA_CLK) from the global write assist clock node (GWA_CLK), which is in the processor power domain, and level shift the global write assist clock signal (GWA_CLK) to the write assist power domain. The source node of the pFET 132 is electrically connected to a write assist positive supply node (VDD_WA).

The write assist circuit 404 includes components, including the dynamic CMOS inverter level translator 126, that are configured to operate in the write assist power domain. The write assist circuit 404 generally operates the same as the write assist circuit 204 of FIG. 2, as described with respect to FIG. 3, except that the memory positive supply voltage (VDD_M) is replaced with a write assist positive supply voltage (VDD_WA) of the write assist power domain. The write assist circuit 404 of FIG. 4 does not operate in the memory power domain, and hence, the memory positive supply voltage (VDD_M) of the memory power domain may be altered independently of the write assist positive supply voltage (VDD_WA) of the write assist power domain.

Figure 5:
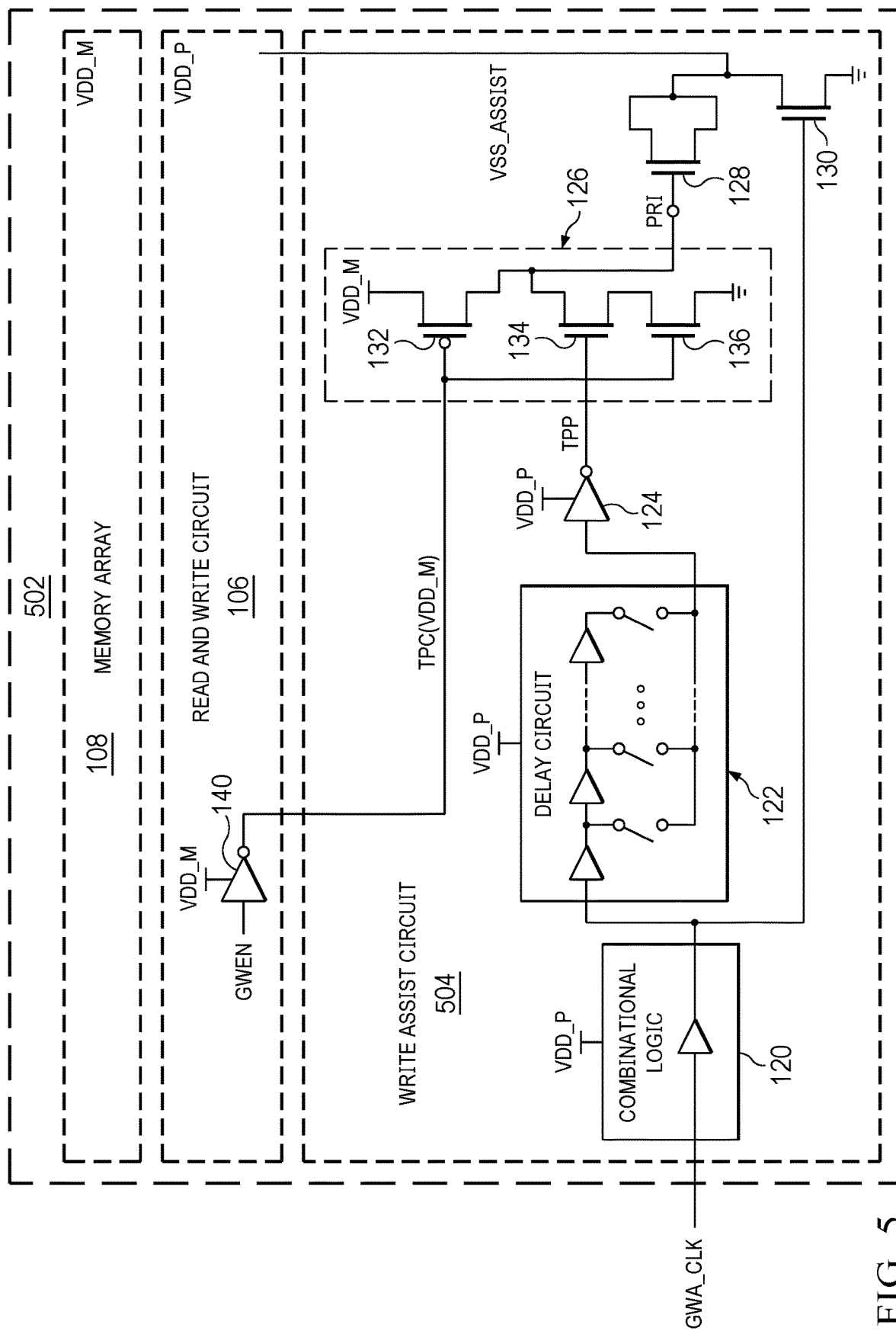
FIG. 5 illustrates a schematic of a page of a memory system according to some examples.

FIG. 5 illustrates a schematic of a page 502 of a memory system according to some examples. The page 502 may be implemented for one or more of the pages 102 of the memory system 100 of FIGS. 1A and 1B. The page 502 includes a write assist circuit 504, a read and write circuit 106, and a memory array 108. The write assist circuit 504 illustrates a more detailed implementation for generating the charging primary trigger signal (TPC). In this example, the desired charging power domain (e.g., the desired charging positive supply voltage (VDD_X)) is the memory power domain (e.g., the memory positive supply voltage (VDD_M)).

The write assist circuit 504 includes components as illustrated in and described with respect to the write assist circuit 104 in FIG. 1A. An output node of the inverter 140 in the read and write circuit 106 of the page 502 is electrically connected to the charging primary trigger node (TPC). As noted previously, the inverter 140 is electrically connected to the memory power domain (and hence, a memory positive supply node (VDD_M)) and has an input node electrically connected to the global write enable node (GWEN). The inverter 140 is configured to receive the global write enable signal (GWEN) from the global write enable node (GWEN), which is in the memory power domain. The inverter 140 is configured to invert the global write enable signal (GWEN) and output the inverted global enable clock signal as the charging primary trigger signal (TPC) to the charging primary trigger node (TPC).

Figure 6:
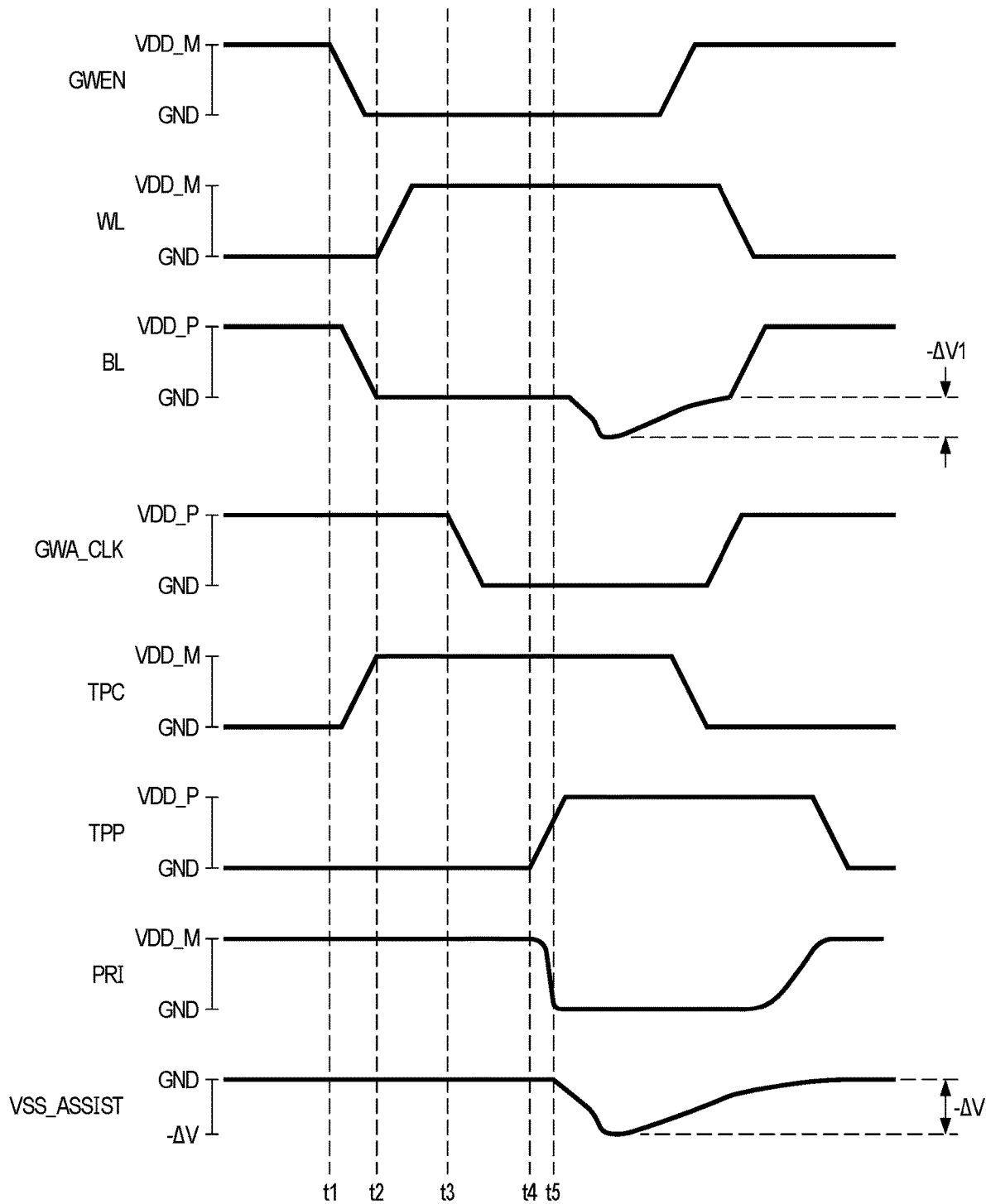
FIG. 6 is a timing graph of signals illustrating operation of a memory system that includes the pages of FIG. 5 according to some examples.

FIG. 6 is a timing graph of signals illustrating operation of a memory system 100 that includes the pages 502 of FIG. 5 according to some examples. FIG. 6 illustrates the global write enable signal (GWEN), an arbitrary word line signal (WL), an arbitrary bit line signal (BL), the global write assist clock signal (GWA_CLK), the charging primary trigger signal (TPC), the processor primary trigger signal (TPP), the primary node voltage (PRI), and the write assist supply voltage (VSS_ASSIST). The polarity of the signals shown in FIG. 6 may be inverted in other examples, and the page 502 may be modified to accommodate any change of polarity of one or more signals.

At time t1, the global write enable signal (GWEN) has a falling edge that indicates initiation of a write operation. Further, at time t1, the falling edge of the global write enable signal (GWEN) causes the charging primary trigger signal (TPC) to have a rising edge, possibly with some delay relative to the falling edge of the global write enable signal (GWEN) due to latency of the inverter 140. Preceding and at time t1, the global write assist clock signal (GWA_CLK) is logically high, and the processor primary trigger signal (TPP) is logically low.

During the time up to time t1, the write assist circuit 504 is in a primary precharge phase. The second nFET 130 and the pFET 132 are in closed (e.g., conducting) states due to the global write assist clock signal (GWA_CLK) being logically high and the charging primary trigger signal (TPC) being logically low, respectively, and the fourth nFET 136 is in an open state due to the charging primary trigger signal (TPC) being logically low. Because the second nFET 130 is closed, the write assist supply node (VSS_ASSIST) is at a ground voltage through the second nFET 130 (e.g., the write assist supply voltage (VSS_ASSIST) is or is approximately the ground voltage). With the pFET 132 closed and the fourth nFET 136 open, the capacitance at the primary node (PRI) (e.g., including the capacitance of the first nFET 128, which may be configured as a MOS capacitor) charges to the memory positive supply voltage (VDD_M). Hence, the primary node voltage (PRI) is high at the memory positive supply voltage (VDD_M) up to time t1. Note, FIG. 6 does not indicate the beginning of the primary precharge phase, so a rise of the charge of the primary node (PRI) is not shown in the precharge phase at time t1. The first nFET 128 may act as a DC isolation capacitor between the write assist supply node (VSS_ASSIST) and the primary node (PRI).

At time t1, the write assist circuit 504 enters into a primary evaluation phase. The pFET 132 and the third nFET 134 are in open states due to the charging primary trigger signal (TPC) being logically high and the processor primary trigger signal (TPP) being logically low, respectively. The primary node (PRI) is in a floating state. The second nFET 130 is in a closed state due to the global write assist clock signal (GWA_CLK) being logically high. The write assist supply node (VSS_ASSIST) is at a ground voltage through the second nFET 130 (e.g., the write assist supply voltage (VSS_ASSIST) is or is approximately the ground voltage).

After time t1, the bit line signal (BL) has a falling edge, and at time t2, the word line signal (WL) has a rising edge. Global circuitry monitors for the falling edge of the bit line signal (BL), and in response to detecting the falling edge of the bit line signal (BL), that global circuitry causes the global write assist clock signal (GWA_CLK) to transition to logically low by a falling edge at time t3 (e.g., some amount of time subsequent to time t2).

At time t3, the second nFET 130 is in an open state due to the global write assist clock signal (GWA_CLK) being logically low. The write assist supply node (VSS_ASSIST)

is in a floating state decoupled from a ground node. Also, at time t3, the third nFET 134 and the pFET 132 are in respective open states.

At time t4, the falling edge of the global write assist clock signal (GWA_CLK) causes the processor primary trigger signal (TPP) to have a rising edge. The delay between time t3 and time t4 includes delay resulting from the propagation of the global write assist clock signal (GWA_CLK) through the delay circuit 122. This delay from the delay circuit 122 may permit the bit line signal (BL) to settle following the falling edge of the bit line signal (BL) at time t1.

At time t5 following time t4, the rising edge of the processor primary trigger signal (TPP) causes the third nFET 134 to become in a closed state. The closed state of the third nFET 134 causes the discharge of primary node (PRI) (e.g., including the capacitance of the first nFET 128, which may be configured as a MOS capacitor), and a negative voltage (e.g., −ΔV) is coupled to write assist supply node (VSS_ASSIST) through the first nFET 128, and hence, on the bit line node (BL) as the bit line signal (BL) through an inverter 150. The closing of the third nFET 134, with the fourth nFET 136 also being closed, causes the primary node (PRI) to be electrically coupled to a ground node, and hence, the primary node voltage (PRI) drops to a ground voltage.

Subsequent to time t5, the global write enable signal (GWEN) has a rising edge, and the charging primary trigger signal (TPC) responsively has a falling edge. Also, the global write assist clock signal (GWA_CLK) has a rising edge. With the global write assist clock signal (GWA_CLK) and the charging primary trigger signal (TPC) being logically high and logically low, respectively, the write assist circuit 504 enters into another primary precharge phase. At the onset of the primary precharge phase, the capacitance at the primary node (PRI) charges to a voltage based on the resistance-capacitance (RC) time constant of the circuit to the memory positive supply voltage (VDD_M).

Figure 7:
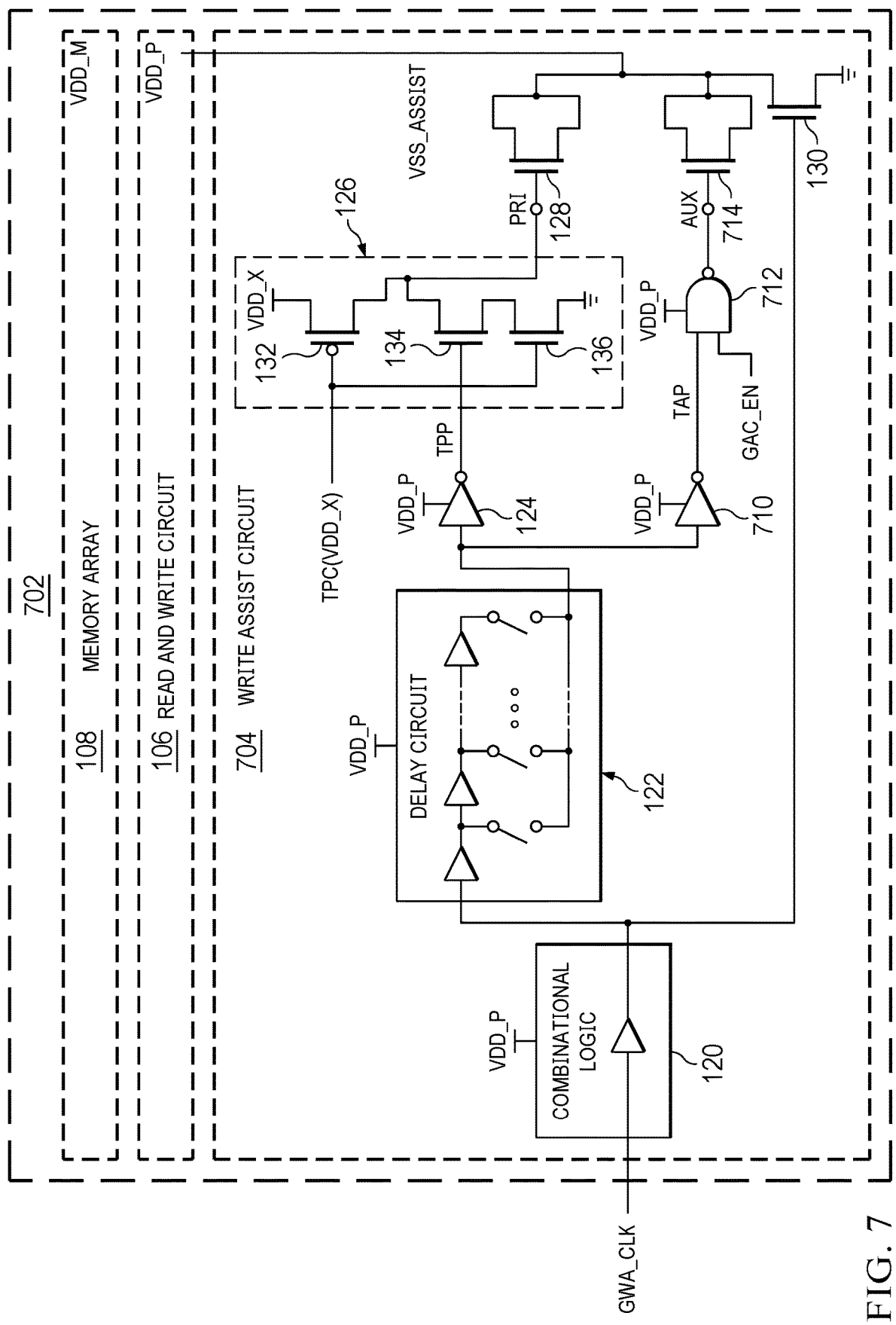
FIG. 7 illustrates a schematic of a page of a memory system according to some examples.

FIG. 7 illustrates a schematic of a page 702 of a memory system according to some examples. The page 702 may be implemented for one or more of the pages 102 of the memory system 100 of FIGS. 1A and 1B. The page 702 includes a write assist circuit 704, a read and write circuit 106, and a memory array 108. The write assist circuit 704 includes an auxiliary circuit to provide an auxiliary negative voltage for the write assist supply node (VSS_ASSIST).

The write assist circuit 704 includes components as illustrated in and described with respect to the write assist circuit 104 in FIG. 1A and further includes the auxiliary circuit. The auxiliary circuit includes an inverter 710, a NAND gate 712, and a fifth nFET 714. The write assist circuit 704 may be configured like the write assist circuit 204, 404, 504 of FIG. 2, 4, or 5 to generate and provide the charging primary trigger signal (TPC) on the charging primary trigger node (TPC).

The inverter 710 and NAND gate 712 are configured to operate in the processor power domain. Hence, the inverter 710 and NAND gate 712 are each electrically connected to a processor positive supply node (VDD_P).

The output node of the delay circuit 122 is further electrically connected to an input node of the inverter 710, and an output node of the inverter 710 is electrically connected to a first input node of the NAND gate 712, which is a processor auxiliary trigger node (TAP). A second input node of the NAND gate 712 is electrically connected to a global write assist auxiliary enable node (GAC_EN). An output node of the NAND gate 712 is electrically connected to a gate node of the fifth nFET 714, which is designated an auxiliary node (AUX). A source node and drain node of the fifth nFET 714 are electrically connected together and to the write assist supply node (VSS_ASSIST) (e.g., and further, to the source and drain nodes of the first nFET 128 and the drain node of the second nFET 130). In this example, the fifth nFET 714 is configured as a capacitor (e.g., a MOS capacitor). Another capacitor can be implemented instead of the fifth nFET 714. The fifth nFET 714 may operate as a DC isolation capacitor.

The write assist circuit 504, in the illustrated example, includes a parasitic capacitance at the auxiliary node (AUX). This parasitic capacitance may be formed from a combination of metal lines or features and/or one or more doped regions in the semiconductor substrate on which the memory system is fabricated. The parasitic capacitance may be included in the capacitance that is to be charged and discharged in an auxiliary precharge phase and an auxiliary evaluation phase described subsequently. In other examples, a structured capacitor may be formed at the auxiliary node (AUX), such as a parallel plate capacitor.

As is apparent from FIG. 7, the processor auxiliary trigger signal (TAP) on the processor auxiliary trigger node (TAP) generally corresponds, or is the same as, the processor primary trigger signal (TPP), which has been discussed previously. When the processor auxiliary trigger signal (TAP) signal and/or the global write assist auxiliary enable signal (GAC_EN) on the global write assist auxiliary enable node (GAC_EN) is logically low, the write assist circuit 704 is in an auxiliary precharge phase for the auxiliary circuit. In the auxiliary precharge phase for the auxiliary circuit, the auxiliary node (AUX) (e.g., including the capacitance of the fifth nFET 714, which may be configured as a MOS capacitor) is charged through the NAND gate 712 to the processor positive supply node (VDD_P). When the processor auxiliary trigger signal (TAP) signal and the global write assist auxiliary enable signal (GAC_EN) are logically high, the write assist circuit 704 is in an auxiliary evaluation phase for the auxiliary circuitry. In the auxiliary evaluation phase, the auxiliary node (AUX) (e.g., including the capacitance of the fifth nFET 714, which may be configured as a MOS capacitor) is discharged, and a negative voltage is coupled to the write assist supply node (VSS_ASSIST) through the fifth nFET 714, and hence, on the bit line node (BL) as the bit line signal (BL) through an inverter 150.

Figure 8:
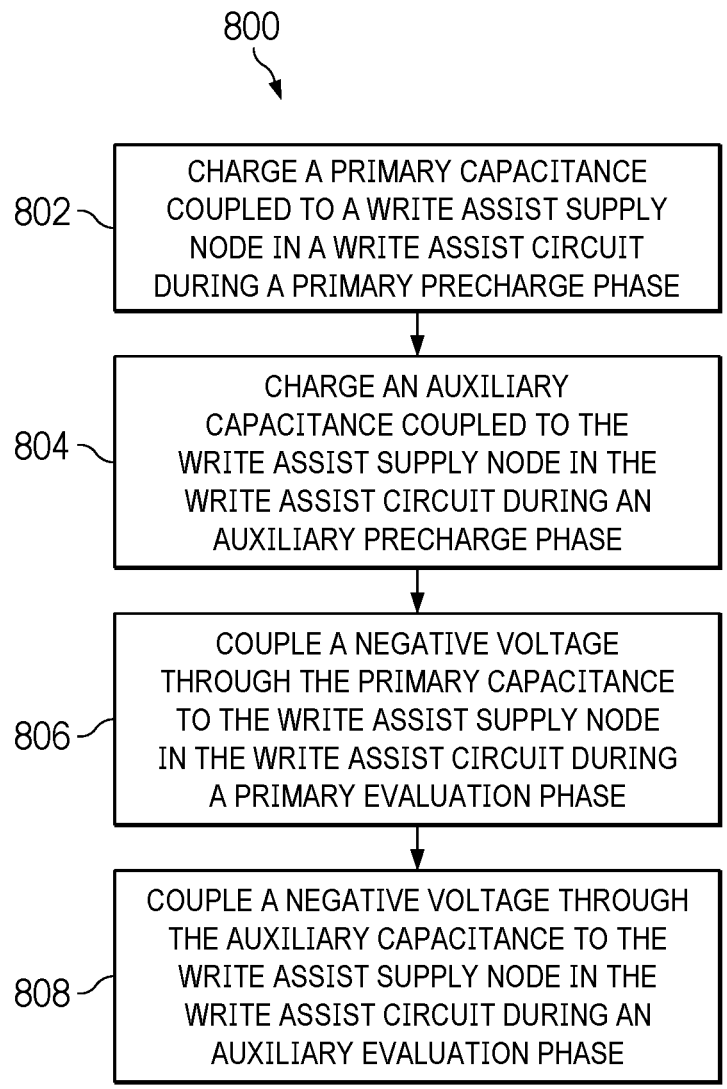
FIG. 8 is a method of operating a memory system according to some examples.

FIG. 8 is a method 800 of operating a memory system according to some examples. The method 800 is described in the context of the memory system 100, including the write assist circuits 104, 204, 404, 504, 704, described previously. Other examples may be implemented in other memory systems.

At 802, a primary capacitance coupled to a write assist supply node in a write assist circuit 104, 204, 404, 504, 704 is charged during a primary precharge phase. The charging of the primary capacitance (e.g., including the capacitance of the first nFET 128) is through a dynamic CMOS inverter level translator 126 in the write assist circuit 104, 204, 404, 504, 704. The primary precharge phase may be as described previously with respect to FIGS. 3 and 6. Charging the primary capacitance is based on the charging primary trigger signal (TPC) generated in the desired charging power domain. When the charging primary trigger signal (TPC) and the global write assist clock signal (GWA_CLK) are logically low and logically high, respectively, for example, the primary capacitance charges with the pFET 132 and the second nFET 130 in closed states and the fourth nFET 136 in an open state.

At 804, an auxiliary capacitance coupled to the write assist supply node in the write assist circuit 704 is charged during an auxiliary precharge phase. The charging of the auxiliary capacitance (e.g., including the capacitance of the fifth nFET 714) is through a NAND gate 712 in the write assist circuit 704. The auxiliary precharge phase may be as described previously with respect to FIG. 7. Charging the auxiliary capacitance is based on the processor auxiliary trigger signal (TAP) and/or the global write assist auxiliary enable signal (GAC_EN). When the processor auxiliary trigger signal (TAP) and/or the global write assist auxiliary enable signal (GAC_EN) is logically low, for example, the auxiliary capacitance charges.

At 806, a negative voltage is coupled through the primary capacitance to the write assist supply node (VSS_ASSIST) in the write assist circuit 104, 204, 404, 504, 704 during a primary evaluation phase. Discharge of the primary capacitance couples a negative voltage to the write assist supply node (VSS_ASSIST). The primary evaluation phase may be as described previously with respect to FIGS. 3 and 6. Discharge of the primary capacitance couples a negative voltage to the write assist supply node (VSS_ASSIST) when the global write assist clock signal (GWA_CLK) is logically low and the charging primary trigger signal (TPC) and processor primary trigger signal (TPP) are logically high. The global write assist clock signal (GWA_CLK) being logically low results in the second nFET 130 being in an open state. The charging primary trigger signal (TPC) being logically high results in the pFET 132 being in an open state and the fourth nFET 136 being in a closed state. The processor primary trigger signal (TPP) being logically high results in the third nFET 134 being in a closed state. In such a configuration, the write assist supply node (VSS_ASSIST) is electrically coupled to the primary capacitance such that the discharge voltage of the primary capacitance couples a negative voltage to the write assist supply node (VSS_ASSIST).

At 808, the negative voltage is coupled through the auxiliary capacitance to the write assist supply node (VSS_ASSIST) of the write assist circuit during an auxiliary evaluation phase. A discharge of the auxiliary capacitance couples a negative voltage to the write assist supply node (VSS_ASSIST) of the write assist circuit 704. The discharge of the auxiliary capacitance couples a negative voltage to the write assist supply node (VSS_ASSIST) using the auxiliary circuit (e.g., the NAND gate 712) and the second nFET 130. The discharge of the auxiliary capacitance coupling a negative voltage to the write assist supply node (VSS_ASSIST) may be in an auxiliary evaluation phase. The discharge of the auxiliary capacitance couples a negative voltage to the write assist supply node (VSS_ASSIST) when the processor auxiliary trigger signal (TAP) and global write assist auxiliary enable signal (GAC_EN) are logically high. The processor auxiliary trigger signal (TAP) and global write assist auxiliary enable signal (GAC_EN) being logically high results in the discharge of auxiliary node and couples a negative voltage to the write assist supply node (VSS_ASSIST).

Some examples may be embodied as an IP core (e.g., a digital or electronic representation) stored in non-transitory memory. For example, a design including a write assist circuit 104, 204, 404, 504, 704 may be embodied as an IP core stored in non-transitory memory. Further, for example, a design including a memory page 102, 202, 402, 502, 702 that includes a write assist circuit 104, 204, 404, 504, 704 may be embodied as an IP core stored in non-transitory memory. A user may be provided access to the IP core stored in the non-transitory memory. The user can incorporate the IP core into a user design with or without modification to the IP core. For example, a user may download or otherwise obtain the IP core (including the design including the write assist circuit) onto a computing system that implements an electronic design automation (EDA) environment, and may incorporate the IP core into another design using the EDA environment. Examples of non-transitory memory include RAM (e.g., static RAM (SRAM) and dynamic RAM (DRAM)), read only memory (ROM), programmable ROM (PROM), erasable programmable ROM (EPROM), electrically erasable programmable ROM (EEPROM), flash, NAND memory, CD-ROM, an optical storage device, a magnetic storage device, etc. The non-transitory memory, in some examples, may be standalone memory, and may be included in any computing system (e.g., a desktop computer, a laptop computer, a server, a database, etc.).

Memory systems 100 implemented with write assist circuits 104, 204, 404, 504, 704 may achieve an advantage of improved negative bit line (NBL) voltages generated. For example, in an implementation of a memory system 100 with a write assist circuit 704 of FIG. 7 having the charging primary trigger signal (TPC) generated as shown in the write assist circuit 504 of FIG. 5, NBL voltages generated on the write assist supply node (VSS_ASSIST) are shown below in Table 2 with corresponding aspects of the system.

TABLE 2

| VDD_M | VDD_P | 6σ weak bit cell write NBL specification | Primary (PRI) and/or Auxiliary (AUX) used | NBL generated on VSS_ASSIST |
|---|---|---|---|---|
| 0.675 V | 0.675 V | −80 mV | DEF | −108 mV |
| 0.675 V | 0.585 V | −81 mV | DEF | −101 mV |
| 0.675 V | 0.495 V | −82 mV | DEF | −98 mV |
| 0.585 V | 0.585 V | −116 mV | DEF + AUX | −128 mV |
| 0.585 V | 0.495 V | −117 mV | DEF + AUX | −122 mV |

As shown in Table 2, the six-sigma (6σ) weak bit cell write NBL specification at each of the listed combinations of memory positive supply voltage (VDD_M) and processor positive supply voltage (VDD_P) was exceeded by the NBL generated on the write assist supply node (VSS_ASSIST). Such a system may enable reductions in positive supply voltages (VDD_P, VDD_M), which in turn may enable reductions in consumed power and current leakage. Even with a reduced memory positive supply voltage (VDD_M), the processor positive supply voltage (VDD_P) may also be reduced while the NBL specification is met or exceed.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:
1. A circuit, comprising:
   a dynamic complementary metal-oxide-semiconductor (CMOS) inverter level translator circuit,
      wherein the dynamic CMOS inverter level translator circuit is electrically connected to a first power domain, wherein the dynamic CMOS inverter level translator circuit has a first input node configured to receive a first trigger signal generated in the first power domain, and wherein the dynamic CMOS inverter level translator circuit has a second input node configured to receive a second trigger signal generated in a second power domain different from the first power domain; and a first capacitor that is electrically coupled to an output node of the dynamic CMOS inverter level translator circuit, wherein the first capacitor selectively charges to the first power domain through the dynamic CMOS inverter level translator circuit based on the first trigger signal, and wherein the first capacitor selectively discharges to provide a negative coupling voltage to a write assist supply node, the write assist supply node being electrically coupled to a negative supply node of a bit line driver circuit of a memory array.

2. The circuit of claim 1, wherein the first power domain is configured to provide a first positive supply voltage, and the second power domain is configured to provide a second positive supply voltage, the first positive supply voltage being greater than the second positive supply voltage.

3. The circuit of claim 1 further comprising an inverter configured to generate the second trigger signal, an output node of the inverter being electrically connected to the second input node of the dynamic CMOS inverter level translator circuit, the inverter being electrically connected to the second power domain.

4. The circuit of claim 1, wherein the first input node of the dynamic CMOS inverter level translator circuit is electrically connected to an output node of an inverter, an input node of the inverter being electrically connected to an output node of a level shifter circuit, the level shifter circuit being electrically connected to the first power domain and the second power domain.

5. The circuit of claim 1 further comprising a write circuit, the write circuit comprising an inverter electrically connected to the first power domain, the first input node of the dynamic CMOS inverter level translator circuit being electrically connected to an output node of the inverter, wherein the memory array comprises bit cells electrically connected to the first power domain.

6. The circuit of claim 1 further comprising:
an auxiliary circuit; and
a second capacitor that is electrically coupled to an output node of the auxiliary circuit,
wherein the second capacitor selectively charges to the second power domain through the auxiliary circuit, and
wherein the second capacitor selectively discharges to provide a negative coupling voltage to the write assist supply node.

7. The circuit of claim 1, wherein the memory array comprises bit cells electrically connected to a third power domain, the third power domain being different from the first power domain and from the second power domain.

8. The circuit of claim 1, wherein the dynamic CMOS inverter level translator circuit comprises:
a p-type transistor having a source node electrically connected to the first power domain;
a first n-type transistor having a drain node electrically connected to a drain node of the p-type transistor, the drain node of the first n-type transistor and the drain node of the p-type transistor electrically connected together being the output node of the dynamic CMOS inverter level translator circuit, a gate node of the first n-type transistor being the second input node of the dynamic CMOS inverter level translator circuit; and
a second n-type transistor having a drain node electrically connected to a source node of the first n-type transistor, a gate node of the p-type transistor being electrically connected to a gate node of the second n-type transistor as the first input node of the dynamic CMOS inverter level translator circuit.

9. A method comprising:
receiving a first trigger signal by a dynamic complementary metal-oxide-semiconductor (CMOS) inverter level translator circuit, wherein the first trigger signal is generated in a first power domain;
charging a voltage of a first capacitor to the first power domain through the dynamic CMOS inverter level translator circuit, wherein the dynamic CMOS inverter level translator circuit is electrically coupled to the first power domain;
receiving a second trigger signal by the dynamic CMOS inverter level translator circuit, wherein the second trigger signal is generated in a second power domain that is different from the first power domain; and
discharging the voltage of the first capacitor through the dynamic CMOS inverter level translator circuit based on the first trigger signal and the second trigger signal.

10. The method of claim 9, wherein a positive supply voltage of the first power domain is greater than a positive supply voltage of the second power domain.

11. The method of claim 9, wherein a memory array comprises bit cells electrically connected to a third power domain, the bit cells being electrically coupled to a driver circuit, the driver circuit being electrically coupled to the first capacitor, the third power domain being different from the first power domain and from the second power domain.

12. The method of claim 9, wherein the first trigger signal is generated comprising:
level shifting a global write assist clock signal from the second power domain to the first power domain by a level shifter circuit; and
inverting the level shifted global write assist clock signal by an inverter, the first trigger signal being the inverted level shifted global write assist clock signal.

13. The method of claim 9, wherein the first trigger signal is generated comprising inverting a global write enable signal by an inverter, the first trigger signal being the inverted global write enable signal.

14. The method of claim 9 further comprising:
charging a voltage of a second capacitor to the second power domain through an auxiliary circuit, the auxiliary circuit being electrically coupled to the second power domain; and
discharging the voltage of the second capacitor through the auxiliary circuit.

15. A non-transitory storage medium storing an electronic representation of a design, the design including a write assist circuit, the write assist circuit comprising:
a dynamic complementary metal-oxide-semiconductor (CMOS) inverter level translator circuit,
wherein the dynamic CMOS inverter level translator circuit is electrically connected to a first power domain,
wherein the dynamic CMOS inverter level translator circuit has a first input node configured to receive a first trigger signal generated in the first power domain, and wherein the dynamic CMOS inverter level translator circuit has a second input node configured to receive a second trigger signal generated in a second power domain different from the first power domain; and a first capacitor that is electrically coupled to an output node of the dynamic CMOS inverter level translator circuit, wherein the first capacitor selectively charges to the first power domain through the dynamic CMOS inverter level translator circuit based on the first trigger signal, and wherein the first capacitor selectively discharges to provide a negative coupling voltage to a write assist supply node, the write assist supply node being electrically coupled to a negative supply node of a bit line driver circuit of a memory array.

16. The non-transitory storage medium of claim 15, wherein the first power domain is configured to provide a first positive supply voltage, and the second power domain is configured to provide a second positive supply voltage, the first positive supply voltage being greater than the second positive supply voltage.

17. The non-transitory storage medium of claim 15, wherein the write assist circuit further comprises an inverter configured to generate the second trigger signal, an output node of the inverter being electrically connected to the second input node of the dynamic CMOS inverter level translator circuit, the inverter being electrically connected to the second power domain.

18. The non-transitory storage medium of claim 15, wherein the first input node of the dynamic CMOS inverter level translator circuit is electrically connected to an output node of an inverter, an input node of the inverter being electrically connected to an output node of a level shifter circuit, the level shifter circuit being electrically connected to the first power domain and the second power domain.

19. The non-transitory storage medium of claim 15 further comprising a write circuit, the write circuit comprising an inverter electrically connected to the first power domain, the first input node of the dynamic CMOS inverter level translator circuit being electrically connected to an output node of the inverter, wherein the memory array comprises bit cells electrically connected to the first power domain.

20. The non-transitory storage medium of claim 15, wherein the memory array comprises bit cells electrically connected to a third power domain, the third power domain being different from the first power domain and from the second power domain.

\* \* \* \* \*